(12) United States Patent
Lovece

(10) Patent No.: US 12,525,936 B2
(45) Date of Patent: Jan. 13, 2026

(54) TUBE AMPLIFIER

(71) Applicant: Stewart Lovece, Brooklyn Heights, OH (US)

(72) Inventor: Stewart Lovece, Brooklyn Heights, OH (US)

( * ) Notice: Subject to any disclaimer, the term of this patent is extended or adjusted under 35 U.S.C. 154(b) by 566 days.

(21) Appl. No.: 18/083,463

(22) Filed: Dec. 16, 2022

(65) Prior Publication Data
US 2024/0072742 A1    Feb. 29, 2024

Related U.S. Application Data

(60) Provisional application No. 63/401,303, filed on Aug. 26, 2022.

(51) Int. Cl.
| | | |
|---|---|---|
| *H03F 3/52* | (2006.01) | |
| *H03F 3/28* | (2006.01) | |
| *H03F 3/36* | (2006.01) | |

(52) U.S. Cl.
CPC ...... *H03F 3/36* (2013.01); *H03F 3/28* (2013.01)

(58) Field of Classification Search
CPC .......... H03F 3/36; H03F 3/28; H03F 2200/03; H03F 1/33; H03F 3/181; H03F 3/68; H04B 2001/0408; H04B 1/04
See application file for complete search history.

(56) References Cited

U.S. PATENT DOCUMENTS

| | | | | |
|---|---|---|---|---|
| 4,532,476 | A * | 7/1985 | Smith | H03F 3/28 330/123 |
| 5,604,461 | A * | 2/1997 | Rozenblit | H03F 1/02 330/81 |
| 6,140,870 | A * | 10/2000 | Cook | H03F 3/181 330/3 |
| 10,063,194 | B1 * | 8/2018 | Quan | H03F 1/30 |

* cited by examiner

*Primary Examiner* — Khanh V Nguyen
(74) *Attorney, Agent, or Firm* — Menlo Park Patents

(57) ABSTRACT

An amplifier circuit including a first stage, second stage and output stage. The first stage includes a cathode biased triode. The amplifier circuit includes a second stage having two long tailed pair triodes, each of the second stage tubes output signals inverted from each other wherein the long-tailed pair triodes are direct current coupled to the output tube's grids, Each cathode biased triode section is direct current coupled to one of the two long tailed pair triodes. The output stage includes two output tubes are in a Circlotron configuration with each output tube's cathode connected to the loudspeaker terminals. Each Bluetooth receiver's ground is connected to the ground of the first stage and the output of each Bluetooth is connected to the grid of the first stage.

18 Claims, 3 Drawing Sheets

TUBE AMPLIFIER

CROSS-REFERENCE TO RELATED APPLICATIONS

This application claims the benefit of U.S. Provisional Patent Application No. 63/401,303, filed on Aug. 26, 2022, which is incorporated by reference herein in its entirety.

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

Trademarks used in the disclosure of the invention, and the applicants, make no claim to any trademarks referenced.

BACKGROUND OF THE INVENTION

1. Field of the Invention

The present invention relates, in general, to a tube amplifier and tube amplifier circuit, and, more specifically, a tube amplifier circuit which does not use coupling devices between the tube stages or a tube amplifier which is electrically isolated from an audio sample source.

2. Description of Related Art

In tube amplifiers, coupling devices such as coupling capacitors, interstage transformers and output transformers are known to degrade the audio signal by adding distortion. Reduction of the distortion can require introduction of even more components and may be costly.

The 6C33C is a very low impedance, high plate current tube that was designed to resist an EMP and 100 G of acceleration for military service.

Circlotron Valve Amplifier

A Circlotron valve amplifier is a type of power amplifier utilizing symmetrical cathode-coupled bridge layout of the output stage. Original Circlotron of 1950s used output transformers to couple relatively high output impedance of vacuum tubes to low-impedance loudspeakers. Circlotron architecture, easily scalable, was eventually adapted to operate without output transformers, and present-day commercially produced Circlotron models are of output transformerless (OTL) type. The electrical bridge of a Circlotron is formed by a matched pair of triodes (V1, V2) and two floating power supplies ('B batteries'), B1+ and B2+. Grids of each triode are driven in opposite phases with a balanced, symmetrical input signal; differential current flows through the loudspeaker load and a simple, relatively high impedance, resistor network that ties floating supplies to the ground. Tubes are usually fixed biased with an external negative power supply ('C battery'); each side normally has independent bias adjustment to compensate for minor tube mismatch.

SUMMARY OF THE INVENTION

Bearing in mind the problems and deficiencies of the prior art, it is therefore an object of the present invention to provide an audio amplifier without any coupling devices since coupling devices are known to degrade the sound reproduction. This is accomplished by discriminating certain frequencies and adding unwanted noise.

It is another object of the present invention to provide an audio amplifier which produces high fidelity sound by eliminating unnecessary components from the signal path.

A further object of the invention is to provide a simple circuit and amplifier circuit to provide better sound without having to alter the sound as provided in existing amplifiers.

It is yet another object of the present invention to provide an amplifier which does not require reduction of the distortion created by coupling devices by the introduction of additional components.

It is still another object of the present invention to provide an amplifier which has a signal fed from a plurality of Bluetooth receivers.

Still other objects and advantages of the invention will in part be obvious and will in part be apparent from the specification.

The above and other objects, which will be apparent to those skilled in the art, are achieved in the present invention which is directed to an amplifier circuit including a first stage including a cathode biased triode and a ground. The amplifier circuit includes a second stage having two long-tailed pair triodes, each of the second stage tubes output signals inverted from each other wherein at least one plate of the cathode biased triode is connected directly to a grid of one of the two long-tailed triodes. The amplifier circuit includes an output stage having two output tubes in a Circlotron configuration with each output tube cathode connected to the loudspeaker terminals wherein the long-tailed pair triodes are direct current coupled to the output tube's grids wherein each cathode biased triode section is direct current coupled to one of the two long tailed pair triodes. The amplifier circuit includes two Bluetooth receivers wherein each Bluetooth receiver's ground is connected to the ground of the first stage and one Bluetooth output is connected to one of the grids of the first stage and another Bluetooth output is connected to a second grid of the first stage. A stereo amplifier circuit may include two amplifier circuits. A sound amplifier for reproduction of sound may include at least one amplifier circuit.

BRIEF DESCRIPTION OF THE DRAWINGS

A further understanding of the nature and advantages of particular embodiments may be realized by reference to the remaining portions of the specification and the drawings, in which like reference numerals are used to refer to similar components. When reference is made to a reference numeral without specification to an existing sub-label, it is intended to refer to all such multiple similar components.

DESCRIPTION OF THE PREFERRED EMBODIMENT(S)

While various aspects and features of certain embodiments have been summarized above, the following detailed description illustrates a few exemplary embodiments in further detail to enable one skilled in the art to practice such embodiments. The described examples are provided for illustrative purposes and are not intended to limit the scope of the invention.

In the following description, for the purposes of explanation, numerous specific details are set forth in order to provide a thorough understanding of the described embodiments. It will be apparent to one skilled in the art however that other embodiments of the present invention may be practiced without some of these specific details. Several embodiments are described herein, and while various features are ascribed to different embodiments, it should be appreciated that the features described with respect to one embodiment may be incorporated with other embodiments as well. By the same token however, no single feature or features of any described embodiment should be considered essential to every embodiment of the invention, as other embodiments of the invention may omit such features.

In this application the use of the singular includes the plural unless specifically stated otherwise and use of the terms "and" and "or" is equivalent to "and/or," also referred to as "non-exclusive or" unless otherwise indicated. Moreover, the use of the term "including," as well as other forms, such as "includes" and "included," should be considered non-exclusive. Also, terms such as "element" or "component" encompass both elements and components including one unit and elements and components that include more than one unit, unless specifically stated otherwise.

The terms "tube" and 'vacuum tube" refer to an electronic vacuum tube as used in a sound amplifier.

Lastly, the terms "or" and "and/or" as used herein are to be interpreted as inclusive or meaning any one or any combination. Therefore, "A, B or C" or "A, B and/or C" mean "any of the following: A; B; C; A and B; A and C; B and C; A, B and C." An exception to this definition will occur only when a combination of elements, functions, steps or acts are in some way inherently mutually exclusive.

As this invention is susceptible to embodiments of many different forms, it is intended that the present disclosure be considered as an example of the principles of the invention and not intended to limit the invention to the specific embodiments shown and described.

In describing the preferred embodiment of the present invention, reference will be made herein to FIGS. 1-3 of the drawings in which like numerals refer to like features of the invention.

Figure 2:
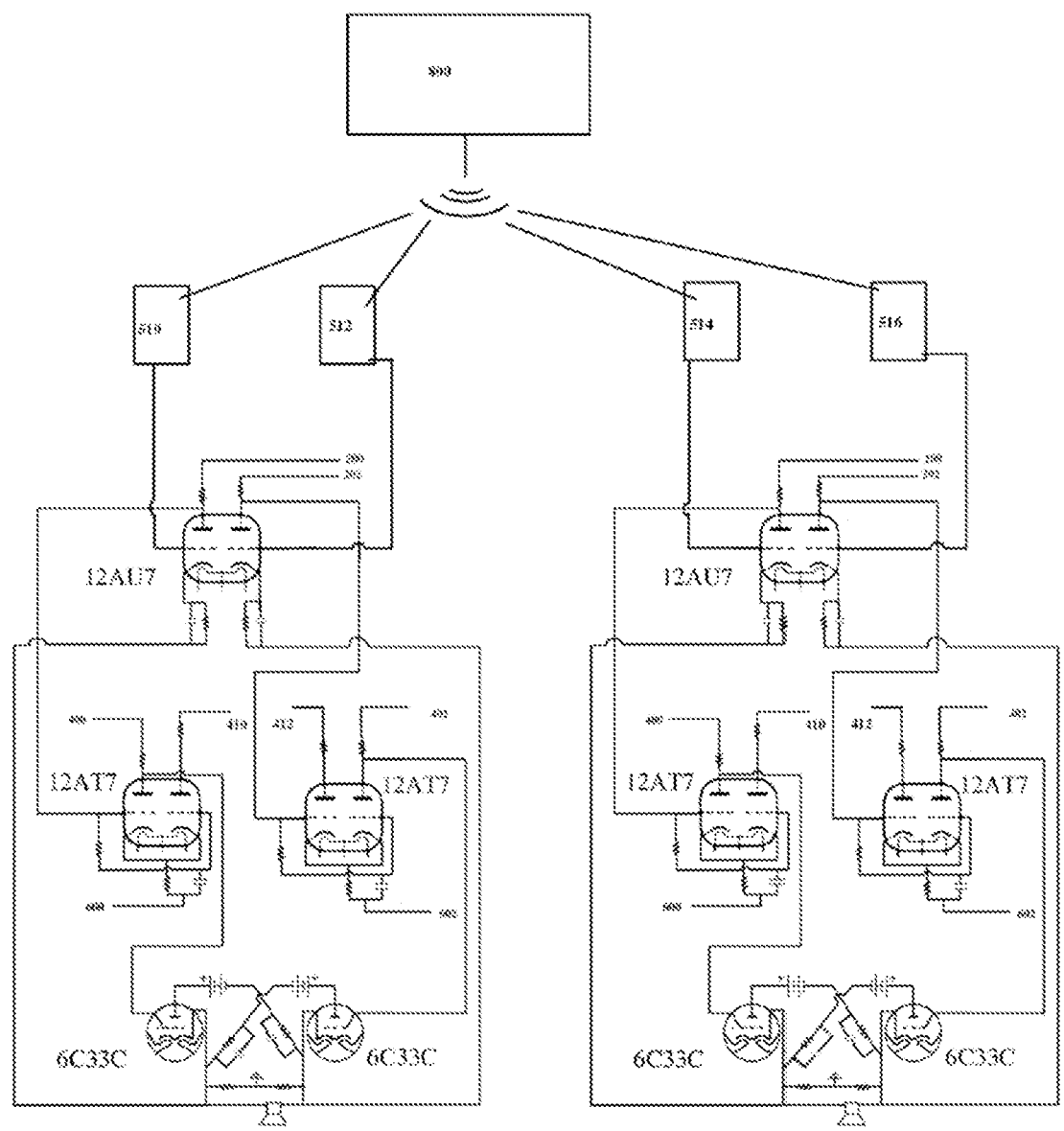
FIG. 2 is a schematic diagram of the amplifier circuit having a signal provided by a plurality of Bluetooth receivers according to the present invention.

As shown in FIG. 2, four independent pre-amps used to drive each of four output tubes. Each pre-amp and output tube combination includes a "floating ground". Each channel includes two floating grounds operating 180 degrees out of phase. The speaker terminals are connected to the floating grounds.

Figure 1:
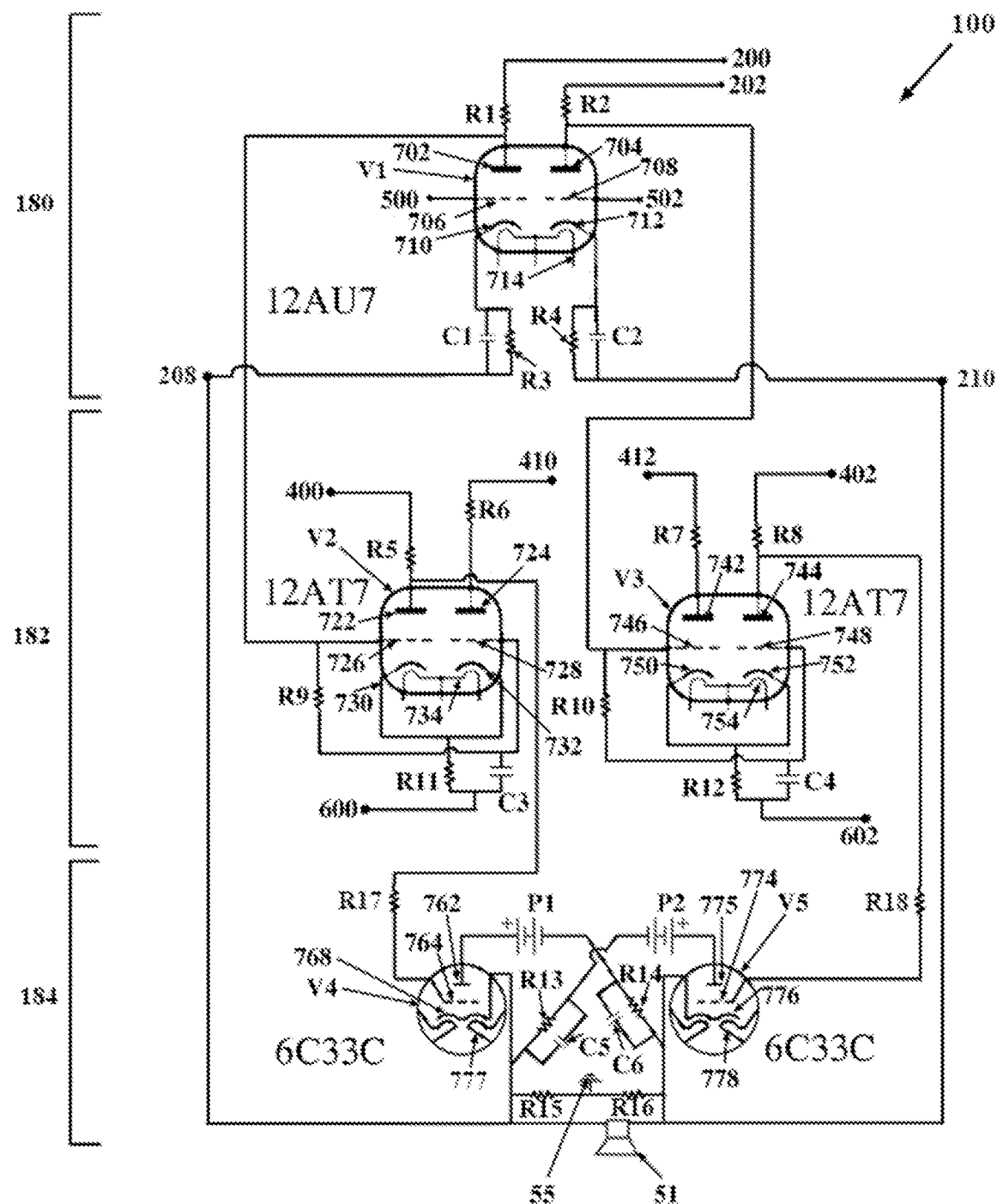
FIG. 1 is a schematic diagram of the amplifier circuit according to the present invention.

The tube amplifier can be expanded to three channels or more, each channel using the amplifier circuit 100 shown in FIG. 1. The sound quality includes a deep bass and very transparent midrange and highs. The tube amplifier eliminates coupling devices such as coupling capacitors, interstage transformers and output transformers that are known to degrade the audio signal by adding distortion.

The tube amplifier circuit 100 as shown in FIG. 1 is a three-stage, DC coupled pre-amp wherein the output stage is configured in a push pull operation and powered entirely by vacuum tubes V1, V2, V3, V4, V5. All B+ power supplies must be independently powered sources, one for each of the output tubes. Signal path simplification was one of the primary goals of the tube amplifier described herein.

The tube amplifier is a direct drive audio amplifier whereby the pre-amplifier is DC coupled to the loudspeaker.

Power Supply

There are preferably nine independent power supplies as follows: Four for the B+ for each of the output tubes. Four for the B+ for the front end (small signal tubes). One half (section) of the 12AU7 and one 12AT7 is "assigned" to each of the output tubes with its own B+ and one large toroidal for the heaters of all tubes.

Components which may be used for the power supply include:

Heater transformer for all tubes—AnTek AS-412, 400 VA, 12 VAC

B+ for the Output tubes—Hammond 1182E17

B+ for small signal tubes and low voltage for the Bluetooth receivers—AnTek AS-05T320.

Diodes—15 A Rectifier Bridge

HV electrolytic caps all rated at 500 VDC, various values.

All amplifier components in each of the four amplifiers are isolated from each other, except at the speakers and the two 1K ohm resistors R15, R16 that "loosely" reference it to the chassis ground.

Tubes

The preamplifier stage 180 includes preamplifier tube V1 which is a cathode biased triode direct current coupled to the inverter stage 182 which consists of vacuum tubes V2, V3 which are each a long-tailed pair triode. Each of the inverter stage vacuum tube V2, V3 output signals are inverted from each other and are direct current coupled to grid 764, 774 of the output tube V4, V5, respectively. The output tubes are preferably in a Circlotron configuration with each cathode 768, 776 of the output tube V4, V5, respectively, connected to the terminals of the loudspeaker or speaker 51. Each Bluetooth receiver's ground is connected to the respective node 208, 210 of the preamplifier stage 180 and the signal output of each Bluetooth is connected to the respective grid 706, 708 of the preamplifier stage 180. The output tubes V4, V5 are both cathode-biased and grid-biased. The cathode-biasing is accomplished with a resistive-capacitance circuit R13, C5 and resistive-capacitance circuit R14, C6 as shown in FIG. 1.

There are 4 Bluetooth receivers for 2 channels and the receivers are synced. One Bluetooth receiver for each section of the first stage and for stereo that requires four Bluetooth receivers. Sync means paired. The signals are all synchronized with each other as though it is acting like one Bluetooth with four separate grounds.

The speaker grounds have to "float" from each other to avoid a short circuit across the speaker terminals.

It is preferable to include a 1 k ohm resistor R17, R18 immediately adjacent to each output tube grid 764, 774 to prevent unwanted oscillations in the output tubes. The 1 k ohm resistors R17, R18 as sometimes called grid stoppers and drawing unwanted current through the output tubes V4, V5.

Identifiers

The following list of identifiers include references to nodes (ex., node 200 in FIG. 1) which are connection terminals or connection points, each node depicted in the drawings as a dot. The nodes are, in general, connection points to a power supply which are preferably isolated from the preamplifier circuit 180, power inverter circuit 182 and output circuit 184.

Node 200 is a connection to +300V Power Supply

Node 202 is a connection to +300V Power Supply cannot be the same power supply as 200 since it has to be separate as circuits "A" and "B" which act independently, except in the second stage.

Plate B 704 of tube V1—connection to grid A 746 of tube V3.

Plate A 702 of tube V1—connection to grid A 726 of tube V2.

Node 208 is common to V1A—connection to V2, cathode of V4 and the ground of Bluetooth A.

Node 210 is common to V1B—connection to V3, cathode of V5 and the ground of Bluetooth B.

Resistor R17 is disposed between the plate 722 of vacuum tube V2 and the grid 764 of output tube V4.

Resistor R18 is disposed between the plate 744 of vacuum tube V3 and the grid 774 of output tube V5.

Node 400 is a connection to +300V Power Supply can be the same power supply as 200 since it must be connected to supply the DC Positive for the first and second stage tubes 400 may use the same power supply as node 410.

Node 402 is a connection to +300V Power Supply.

Node 402 may be common with node 202 but not with node 400. Node 402 may use the same power supply as node 412.

Node 410 is a connection to +300V Power Supply. Node 410 may be common with node 200.

Node 412 is a connection to +300V Power Supply. Node 412 may use the same power supply as node 402 which may use the same power supply as node 202.

Node 500 connects grid 706 of pre-amplifier tube V1 and to the output signal of Bluetooth Receiver 510.

Node 502 connects grid 708 of pre-amplifier tube V1 and to the output signal of Bluetooth Receiver 512.

Node 600 is common to a connection of resistor R11, capacitor C3, the signal output of Bluetooth Receiver 510 and the ground connection for the power supply used at node 200.

Node 602 is common to a connection of resistor R12, capacitor C4, the signal output of Bluetooth Receiver 512 and the ground connection for the power supply used at node 202.

Another aspect of the present invention is directed to an amplifier circuit including a first stage having a cathode biased triode and a ground. The amplifier circuit incudes a second stage including two long-tailed pair triodes, each of the second stage tubes output signals inverted from each other wherein at least one plate of the cathode biased triode is connected directly to a grid of one of the two long-tailed triodes. The amplifier circuit includes an output stage including two output tubes in a Circlotron configuration with each output tube cathode connected to the loudspeaker terminals wherein the long-tailed pair triodes are direct current coupled to the output tube's grids wherein each cathode biased triode section is direct current coupled to one of the two long tailed pair triodes. The amplifier circuit includes two Bluetooth receivers wherein each Bluetooth receiver's ground is connected to the ground of the first stage and one Bluetooth output is connected to one of the grids of the first stage and another Bluetooth output is connected to a second grid of the first stage. A stereo amplifier circuit may include two amplifier circuits.

Another aspect of the present invention is directed to a sound amplifier as shown in FIG. 2 of the drawings. The sound amplifier includes at least one amplifier circuit including a first stage having a cathode biased triode and a ground. The amplifier circuit includes a second stage including two long-tailed pair triodes, each of the second stage tubes output signals inverted from each other wherein at least one plate of the cathode-biased triode is connected directly to a grid of one of the two long-tailed triodes. The amplifier circuit includes an output stage including two output tubes in a Circlotron configuration with each output tube cathode connected to the loudspeaker terminals wherein the long-tailed pair triodes are direct current coupled to the output tube's grids wherein each cathode biased triode section is direct current coupled to one of the two long tailed pair triodes. The amplifier circuit includes two Bluetooth receivers wherein each Bluetooth receiver's ground is connected to the ground of the first stage and one Bluetooth output is connected to one of the grids of the first stage and another Bluetooth output is connected to a second grid of the first stage. The sound amplifier may be a stereo amplifier including two amplifier circuits.

The filament (heater) transformer is preferably an AnTek AS-412-400 VA 12 Volt Transformer where the 6C33C tubes are powered with 12 volts AC and the 12AU7 and 12AT7 tubes are also powered from this transformer but rectified and filtered to 12 VDC. The AnTek AS-05T320 transformer (4 each) powers the B+ for the 12AU7 and 2AT7 (320V tap) and the 6.3V secondaries powers the four Bluetooth receivers separately. The Hammond 1182J117 Transformer (4 each) powers the B+ for each of the 6C33C tubes, each with two secondaries in parallel with a nominal voltage of 117 VAC.

The preamplifier circuit 180 includes the 12AU7 preamplifier tube V1. Resistor R1 is connected between power supply 200 and plate 702 of 12AU7 preamplifier tube V1. Resistor R2 is connected between power supply 202 and plate 704 of 12AU7 preamplifier tube V1.

The phase inverter/driver stage 182 includes the 12AT7 tubes V2, V3. The phase inverter/driver stage 182 may also be referred to as the inverter stage.

The audio output stage 184 includes the 6C33C output tubes V4, V5.

Bluetooth

Four BT synced receivers act independent of one another and provides a balanced signal to the pre-amp. An example of the Bluetooth receiver which may be uses is the Avantree Model WSTR-2403-RX. Each of the Bluetooth receivers are kept charged or powered with their own 5 VDC regulated power supply. Everything in the amplifier is isolated where the only commonality are the speakers and the heaters (which are isolated from their cathodes).

The AUX output signal wire of each Avantree receiver goes to the grid of the 12AU7 and the ground of the AUX output goes to the "floating" ground of the same 12AU7. This is repeated for each additional Avantree receiver. Each Avantree receiver is powered by a separate secondary 6.3 volt winding of the Hammond transformers. Each transformer has two windings×2 transformers=one winding for each Avantree. The transformer output is rectified with a bridge rectifier, filtered and regulated to a voltage of 5 VDC to power each receiver using an LM7805 voltage regulator or equivalent.

Figure 3:
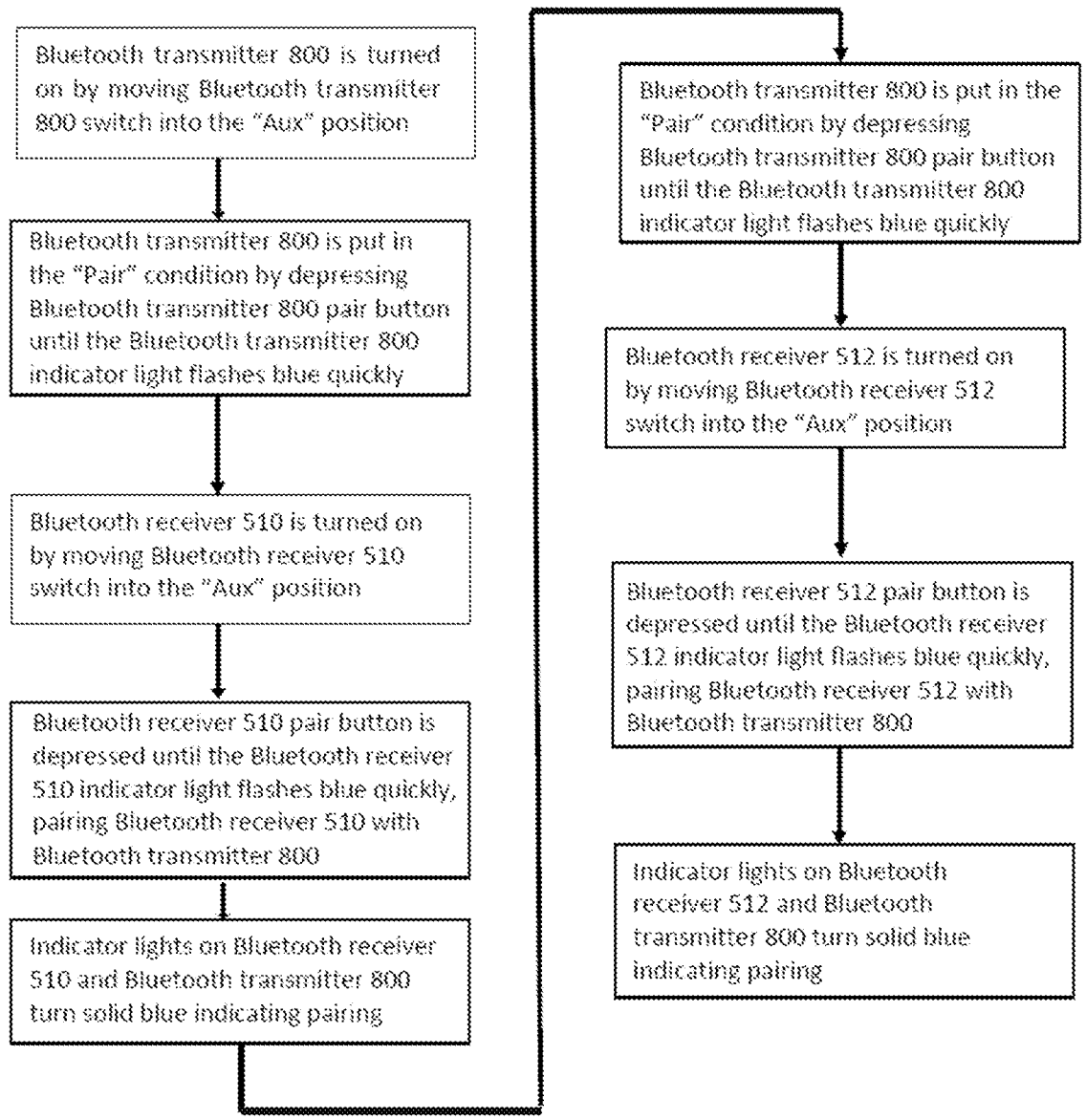
FIG. 3 is a flowchart showing the steps required for pairing the Bluetooth transmitter to the Bluetooth receivers.

FIG. 3 shows a flowchart for connecting the plurality of Bluetooth receivers with the Bluetooth transmitter. The Bluetooth transmitter is turned on by moving the first Bluetooth transmitter switch into the "Aux" position. The Bluetooth transmitter is put in the "Pair" condition by depressing the Bluetooth transmitter pair button until the Bluetooth transmitter indicator light flashes blue quickly. The first Bluetooth receiver switch is put into the "Aux" position to power on the first Bluetooth receiver and the Bluetooth receiver pair button is depressed until the Bluetooth receiver indicator light flashes blue quickly. Once the first Bluetooth receiver and the Bluetooth transmitter are paired, the receiver indicator light and the transmitter indicator light turn solid blue. The Bluetooth transmitter is again put in the "Pair" condition by depressing the transmitter pair button until the indicator light flashes blue quickly. The second Bluetooth receiver switch is put into the "Aux" position to power on the second Bluetooth receiver, and the second Bluetooth receiver pair button is depressed until the second Bluetooth receiver indicator light flashes blue quickly. Once the second Bluetooth receiver and the Bluetooth transmitter are paired, the second Bluetooth receiver indicator light and the Bluetooth transmitter indicator light turn solid blue.

Some or all of the following components may be included in any of the tube amplifier kits described in the following:
Preferable Resistive and Capacitive Components
- Resistors R1, R2 are each a 42 k ohm Plate Load Resistor which allows the respective plate 702, 704 of vacuum tube V1 to have large voltage swings for amplification.
- Resistors R3, R4 are each a 400 ohm Cathode Bias Resistor which allows proper voltage bias for the cathode 710, 712, respectively, of preamplifier tube V1.
- Capacitors C1, C2 are each a 400 of Cathode Bypass Capacitor for eliminating negative feedback the cathode 710, 712, respectively, of preamplifier tube V1.
- Resistors R5, R6, R7, R8 are each an 80 k ohm Plate Load Resistors which allows the plate 722, 724, 742, 744, respectively, of vacuum tubes V2 and V3 to have large voltage swings for amplification.
- Resistors R9, R10 are each a 470 k ohm Grid Resistor for providing a bias voltage for the grid 726, 728, 746, 748, respectively, of tubes V2 and V3.
- Resistors R11, R12 are each a 250 k ohm Cathode Bias trim potentiometer for allowing proper voltage for the cathode 730, 732, 750, 752, respectively, for tubes V2 and V3.
- Capacitors C3, C4 are each a 0.1 uf capacitor which holds the grid 726, 728, 746, 748, respectively, of tubes V2 and V3 at a constant voltage with respect to the "Ground" by filtering out the signal.
- Resistors R13, R14 are each a 600 ohm, 100 watt Cathode Bias Resistor for allowing proper voltage bias for the output tubes V4, V5.
- Capacitors C5, C6 are each a 500 uf Cathode Bypass Capacitor which eliminates negative feedback on the cathode 768, 776, respectively, of the output tubes V4, V5.
- Resistors R15, R16 are each a 1 k resistor which references each leg of the output signal to chassis ground 55 while allowing for a voltage swing.
- Resistors R17, R18 are each a 1 k resistor for preventing oscillations at the grid 764, 774 of the output tubes V4, V5.

Another aspect of the present invention is directed to a tube amplifier kit comprising a first stage including a cathode biased triode and a ground, a second stage including two long-tailed pair triodes, an output stage including two output tubes, two Bluetooth receivers 510, 512 and a Bluetooth transmitter 800. The tube amplifier kit includes a plurality of power supplies, at least 13 resistors, at least 4 capacitors and five tube sockets. The tube amplifier kit may include a set of instructions. The tube amplifier kit may include a chassis, at least one switch and at least one fuse. The tube amplifier kit may include a plurality of prepared wires. A stereo amplifier kit includes at least two tube amplifier kits which may be of any configuration described above.

The B+ for each of the output tubes 6C33C may consists of:
5 each 560 MFD, 500 VDC electrolytic capacitors;
3 each 20-ohm, 12-watt resistors;
1 each 15-amp, 1000 PIV rated bridge rectifier; and
1 each 10-nano farad, 600-volt snubber film capacitor.
The preferred components listed provide a filtered and stable DC power supply.

The cathode biased triode is preferably a 12AU7 vacuum tube. The two long-tailed pair triodes are preferably 12AT7 vacuum tubes. The output tube are preferably 6C33C vacuum tubes. It is more preferable that the cathode biased triode is a 12AU7 vacuum tube, the two long-tailed pair triodes are 12AT7 vacuum tube and the output tubes are 6C33C vacuum tubes.

The chassis may consist of 2 each steel Hammond boxes bolted together. The two chassis are each preferably 10"×17"×4" high and each is preferably covered with a cage for safety considerations, the cage measuring 10"×17"×5" high. Fuses in the power supplies protect both in building the unit and in using the amplifier and protect the transformers and other components. A main fuse is provided for overcurrent protection.

While various aspects and features of certain embodiments have been summarized above, the following detailed description illustrates a few exemplary embodiments in further detail to enable one skilled in the art to practice such embodiments. The described examples are provided for illustrative purposes and are not intended to limit the scope of the invention.

As this invention is susceptible to embodiments of many different forms, it is intended that the present disclosure be considered as an example of the principles of the invention and not intended to limit the invention to the specific embodiments shown and described.

Thus, having described the invention, what is claimed is:

The invention claimed is:
1. A tube amplifier comprising:
a first stage including a cathode biased triode having a first and second cathode biased triode grid and a first and second cathode biased triode plate;
a second stage including a first and second long-tailed pair triodes wherein each of the second stage long-tailed pair triodes has output signals inverted from each other and wherein the first cathode biased triode plate is connected directly to a grid of the first long-tailed triode and the second cathode biased triode plate is connected directly to grid of the second long-tailed triode grid;
an output stage including a first and second output tube in a Circlotron configuration with the first output tube including a first output tube cathode connected to a first loudspeaker terminal and the second output tube including a second output tube cathode connected to a second loudspeaker terminal, wherein each of the first and second long-tailed pair triodes are direct current coupled to a first and second output tube grid respectively and wherein the first and second cathode biased triode plates are direct current coupled to the first and second long tailed pair triodes respectively; and
a first and second Bluetooth receiver, wherein a first Bluetooth receiver output is connected to one of the cathode biased triode grids of the first stage and another Bluetooth receiver output is connected to a second cathode biased triode grid of the first stage.
2. A stereo amplifier comprising at least two tube amplifiers according to claim 1.
3. The tube amplifier according to claim 1 wherein the cathode biased triode is a 12AU7 vacuum tube.

4. The tube amplifier according to claim 1 wherein each long-tailed pair triode is a 12AT7 vacuum tube.

5. The tube amplifier according to claim 1 wherein each output tube is a 6C33C.

6. The tube amplifier according to claim 1 wherein the cathode biased triode is a 12AU7 vacuum tube and each long-tailed pair triode is a 12AT7 vacuum tube.

7. The tube amplifier according to claim 6 wherein each output tube is a 6C33C.

8. An amplifier circuit comprising:
   a first stage including a cathode biased triode having a first and second cathode biased triode grid and a first and second cathode biased triode plate;
   a second stage including a first and second long-tailed pair triodes wherein each of the second stage long-tailed pair triodes has output signals inverted from each other and wherein the first cathode biased triode plate is connected directly to a grid of the first long-tailed triode and the second cathode biased triode plate is connected directly to grid of the second long-tailed triode grid; and
   an output stage including a first and second output tube in a Circlotron configuration with the first output tube including a first output tube cathode connected to a first loudspeaker terminal and the second output tube including a second output tube cathode connected to a second loudspeaker terminal;
   wherein each of the first and second long-tailed pair triodes are direct current coupled to a first and second output tube grid respectively; and
   wherein the first and second cathode biased triode plates are direct current coupled to the first and second long tailed pair triodes respectively.

9. The amplifier circuit according to claim 8 wherein the cathode biased triode is a 12AU7 vacuum tube.

10. The amplifier circuit according to claim 8 wherein each long-tailed pair triode is 12AT7 vacuum tube.

11. The amplifier circuit according to claim 8 wherein each output tube is a 6C33C.

12. The amplifier circuit according to claim 8 wherein the cathode biased triode is a 12AU7 vacuum tube and each long-tailed pair triode is a 12AT7 vacuum tube.

13. The amplifier circuit according to claim 12 wherein each output tube is a 6C33C.

14. A tube amplifier kit comprising:
   a first stage including a cathode biased triode;
   a second stage including two long-tailed pair triodes;
   an output stage including two output tubes;
   two Bluetooth receivers; and a Bluetooth transmitter;
   a plurality of power supplies;
   at least 13 resistors;
   at least 4 capacitors; and
   five tube sockets.

15. The tube amplifier kit according to claim 14 including a set of instructions.

16. The tube amplifier kit according to claim 14 including a chassis, at least one switch and at least one fuse.

17. The tube amplifier kit according to claim 14 including a plurality of prepared wires.

18. A stereo amplifier kit comprising at least two tube amplifier kits according to claim 5.

* * * * *